(12) United States Patent
Wang

(10) Patent No.: US 8,912,093 B2
(45) Date of Patent: Dec. 16, 2014

(54) DIE SEAL LAYOUT FOR VFTL DUAL DAMASCENE IN A SEMICONDUCTOR DEVICE

(71) Applicant: Spansion LLC, Sunnyvale, CA (US)

(72) Inventor: Fei Wang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/865,714

(22) Filed: Apr. 18, 2013

(65) Prior Publication Data

US 2014/0312465 A1 Oct. 23, 2014

(51) Int. Cl.
| H01L 21/70 | (2006.01) |
| H01L 21/76 | (2006.01) |
| H01L 21/285 | (2006.01) |
| H01L 29/40 | (2006.01) |

(52) U.S. Cl.
CPC .............. *H01L 29/407* (2013.01); *H01L 21/76* (2013.01); *H01L 21/28506* (2013.01)
USPC .................................. 438/638; 257/E21.579

(58) Field of Classification Search
CPC .................... H01L 21/76808; H01L 21/31144
USPC ........................... 257/E21.579; 438/637, 638
See application file for complete search history.

(56) References Cited

U.S. PATENT DOCUMENTS

| 6,498,092 | B2 | 12/2002 | Lee et al. | |
| 7,592,258 | B2 * | 9/2009 | Lehr et al. | 438/687 |
| 8,710,595 | B2 * | 4/2014 | Tsutsue et al. | 257/409 |
| 2003/0020175 | A1 * | 1/2003 | Umemoto | 257/774 |
| 2003/0170978 | A1 | 9/2003 | Lee | |
| 2005/0118800 | A1 * | 6/2005 | Brakensiek et al. | 438/633 |
| 2006/0073695 | A1 | 4/2006 | Filippi et al. | |
| 2007/0004214 | A1 * | 1/2007 | Schaller et al. | 438/700 |
| 2011/0121416 | A1 | 5/2011 | Quevy et al. | |

FOREIGN PATENT DOCUMENTS

| KR | 10-2002-0009211 A | 2/2002 |
| KR | 10-2003-0095445 A | 12/2003 |

OTHER PUBLICATIONS

International Search Report and Written Opinion of the International Searching Authority for International Application No. PCT/US2014/034367, mailed Aug. 21, 2014.

English language abstract of Korean patent publication No. 10-2003-0095446 A.

* cited by examiner

*Primary Examiner* — John C Ingham
(74) *Attorney, Agent, or Firm* — Sterne, Kessler, Goldstein & Fox PLLC

(57) ABSTRACT

A semiconductor may include several vias located in an active region and a die seal region. In the active region, a photoresist can be patterned with openings corresponding to the vias. In the die seal area, however, the photoresist can be patterned to overlap the vias. With this configuration, an underlayer etch will not affect an underlayer resist in the die seal area, allowing the die seal area to be disregarded for purposes of calculating a process window.

13 Claims, 14 Drawing Sheets

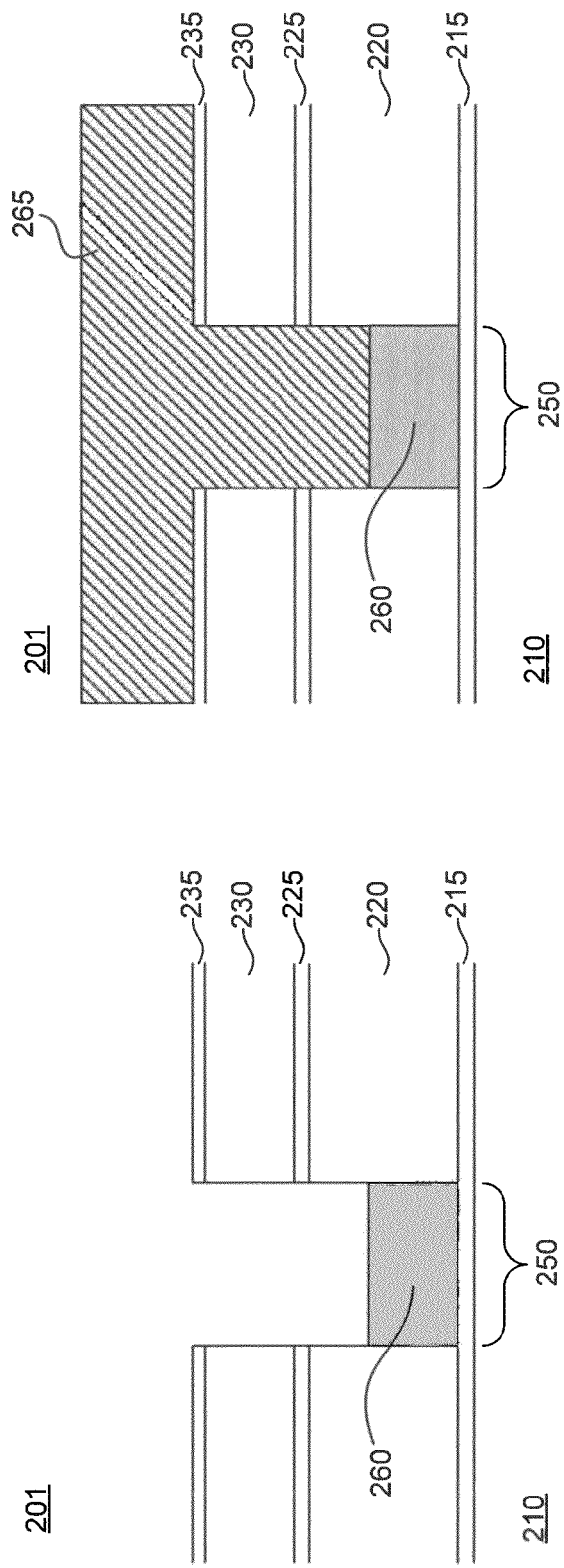

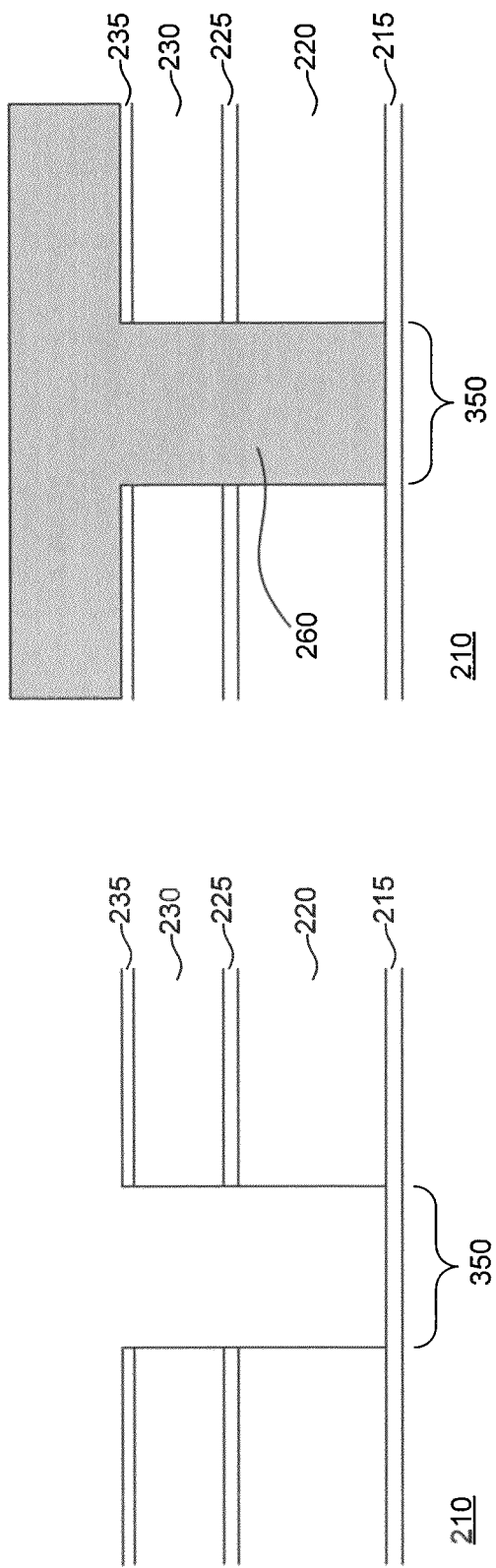

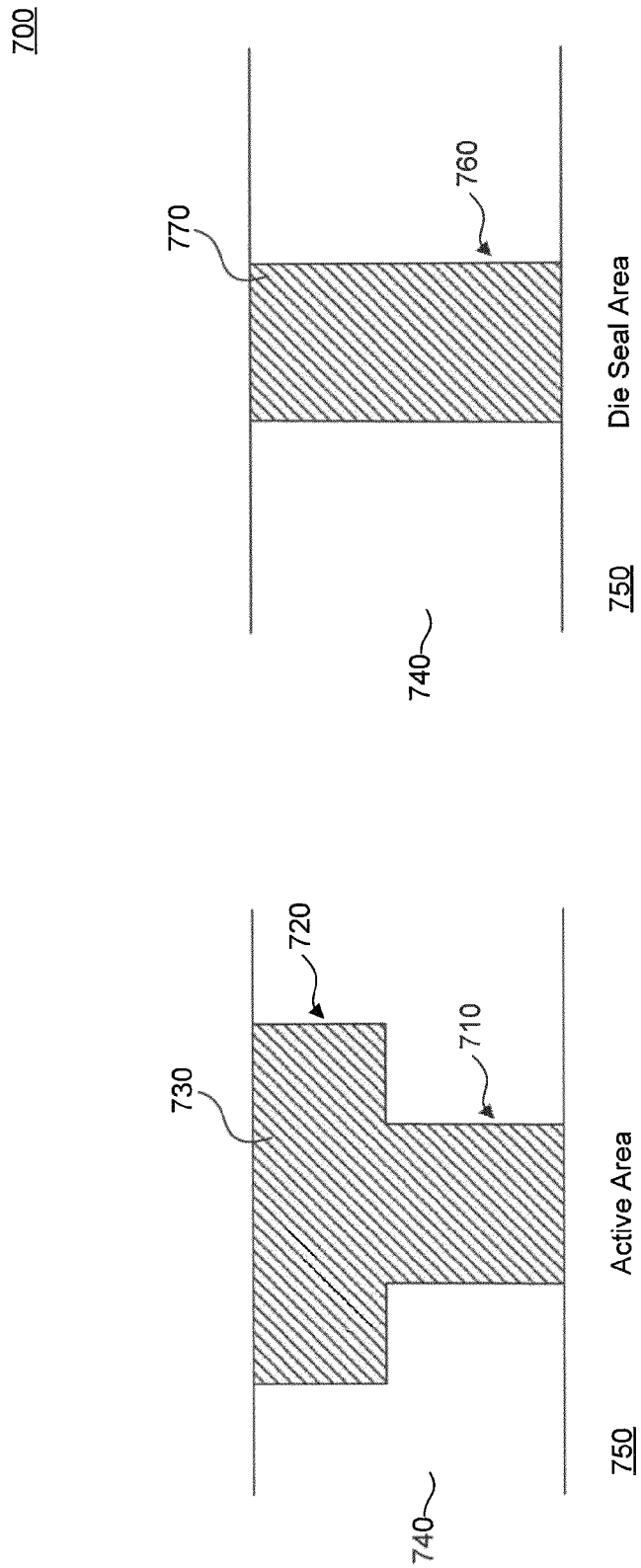

DIE SEAL LAYOUT FOR VFTL DUAL DAMASCENE IN A SEMICONDUCTOR DEVICE

BACKGROUND

1. Technical Field

The disclosure generally relates to formation of semiconductor elements, and specifically to performing a via first trench last (VFTL) process in a die seal area of a semiconductor device.

2. Related Art

In semiconductor device manufacturing, it is often necessary to use metal fill technology to form metal in a dielectric trench and via for interconnecting different layers and/or different metal materials in the semiconductor device. One such metal fill process is commonly referred to as a "damascene" process, in which dielectric layers are first etched, and then filled with a desired metal material. There are two types of commonly-used damascene processes: (1) single damascene—separately etching and filling a trench (used for inter-level connections) and a via (used for intra-level connections); and (2) dual damascene—etching the trench and via, and then filling them together at the same time. Generally, dual damascene is preferred over single damascene processes due to reduced manufacturing costs, etc. FIG. 1A illustrates an preferred semiconductor cross-section after an ideal dual damascene etch. However, various process conditions often cause resulting profiles to be deviated from the desired profile. For purposes of the following discussion, FIGS. 1B and 1C illustrate exemplary semiconductor devices that result from conventional dual damascene processes, and which include an upper dielectric 130, a lower dielectric 120, a via 150, and a trench 155.

There are two preferred types of dual damascene processes that are common in the industry: Trench first via last (TFVL) and via first trench last (VFTL). In TFVL, as its name implies, the trench is etched prior to the via. For example, a first mask is used to define a width of the trench. The device is then etched, using the first mask as a guide to etch the trench in an upper dielectric. Following the creation of the trench, a second mask is patterned within the trench to define a width of the via. A second etch is then performed, using the second mask as a guide, to form the via in a lower dielectric. Once the trench and via have been formed, they are filled with a metal material, such as copper, for example. In VFTL, on the other hand, the via is etched before the trench. In particular, a first mask is used to define the width of the via. The via is formed by etching, using the first mask as a guide, through both an upper and lower dielectric. Once the via has been formed, a spin-on planarization process are used to fill the via holes and provide better pattern process windows. Usually, spin on organic (e.g., resist or organic BARC) or dielectric materials (e.g., spin-on-glass (SOG) or spin on low k materials) are used to fill the via holes and to planarize the wafer surface. After surface planarization, a second mask is formed over the upper dielectric to define a width of the trench. The trench is then formed by etching, using the second mask as a guide, through only the upper dielectric.

As mentioned above, in these conventional VFTL processes a planarization step using a spin technique is used to fill the via holes and to planarize the wafer surface. As a result, the spin-on underlayer may not have uniform thickness among all areas of the semiconductor device. For example, the spin on layer may be thicker in isolated via holes or areas having no vias of the semiconductor device and thinner in the area where via holes are more dense. The thinnest spin on layer will be in a die seal area (e.g., an area of the semiconductor die having a continuous trench line located at the edge of the device area, which is used to stop cracks caused during a cutting process from harming the functional areas), where the trenches are larger and require more spin on materials to fill the trench holes. As a result of the non-uniform coating of the spin on layer, a subsequent etching process may cause defects in the semiconductor device that can greatly affect performance.

For example, FIG. 1A illustrates a side view of the desired semiconductor device profile resulting from a VFTL process. FIGS. 1B and 1C illustrate deviations from the desirable profile and can be easily found in many semiconductor devices that employ VFTL approaches. In each area, an etch-stop layer 115, a via tetraethylorthosilicate (TEOS) layer 120 (e.g., lower dielectric layer), a silicon layer 125, a trench TEOS layer 130 (e.g., upper dielectric layer), and a silicon-rich nitride layer 135 are formed over a substrate 110, separated by a via 150 and a trench 155.

As shown in FIG. 1B, when the spin on layer is too thick, the subsequent etching of the conventional processes produces undesired fencings 190 in the final structure. Similarly, as shown in FIG. 1C, when the spin on layer is too shallow, the etching of the conventional processes produces undesired sub-trenches 195. Both the fencings 190 and the sub-trenches 195 can cause reliability concerns and defects, which will greatly affect performance of the device. Therefore, it is desired to perform the VFTL processes in a manner that can prevent the formation of these defects in order to enhance device performance and manufacturing yield.

BRIEF SUMMARY OF THE INVENTION

In the VFTL dual damascene process, a first mask (via mask) will include the via holes and die seal openings. The subsequent via etch process will etch vias and die seals through both top and bottom dielectric layers. However, a second mask (metal trench mask) will only open the trench lines in the device area without opening die seals. With this configuration, a subsequent trench etch process will not damage trench corners or cause contamination issues near the die seal area, allowing the die seal area to be disregarded for purposes of calculating a process window.

BRIEF DESCRIPTION OF THE DRAWINGS/FIGURES

Embodiments are described herein with reference to the accompanying drawings. In the drawings, like reference numbers generally indicate identical or functionally similar elements. Additionally, generally, the left most digit(s) of a reference number identifies the drawing in which the reference number first appears.

FIGS. 2A-2H illustrate cross-sectional views of a die seal area of an exemplary semiconductor device, according to an embodiment;

FIGS. 3A-3I illustrate cross-sectional views of an active area of an exemplary semiconductor device, according to an embodiment;

FIG. 7 illustrates a cross-sectional view of an exemplary semiconductor device according to an embodiment.

DETAILED DESCRIPTION

Figure 1A:
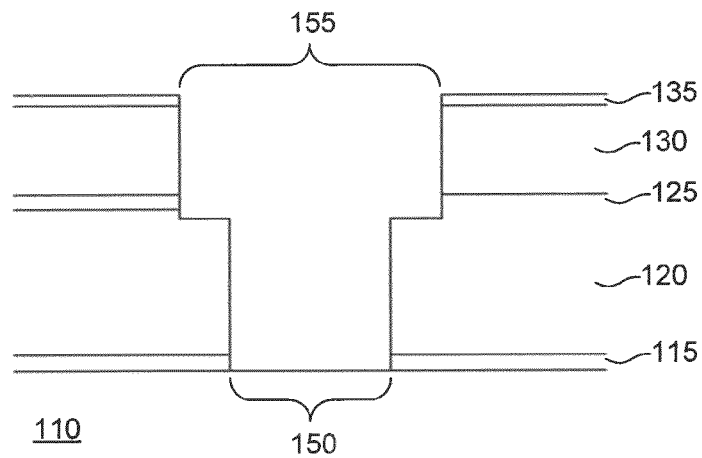
FIG. 1A illustrates a cross-sectional view of a desired functional and die seal area of a semiconductor device resulting from a VFTL process.
Figure 1B:
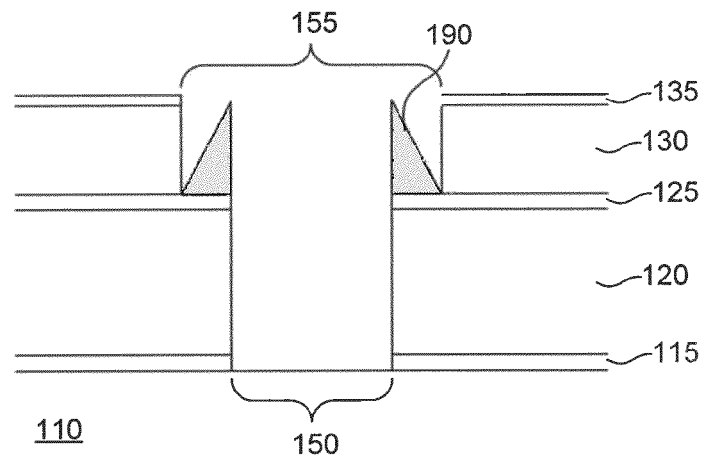
FIGS. 1B and 1C illustrate cross-sectional views of an exemplary functional and die seal area of a semiconductor device resulting from a conventional VFTL process.

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the Detailed Description is not meant to limit the invention. Rather, the scope of the invention is defined only in accordance with the following claims and their equivalents.

Method embodiments may be implemented in hardware (e.g., circuits), firmware, software, or any combination thereof. Method embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

The following Detailed Description of the exemplary embodiments will so fully reveal the general nature of the invention that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Those skilled in the relevant art(s) will recognize that this description may be applicable to many various semiconductor devices, and should not be limited to flash memory devices, or any other particular type of semiconductor devices. In addition, the following descriptions specifically relate to resist etch back process flow. However, the disclosure can similarly be applied to each of the conventional bi-layer resist and tri-layer dual damascene process flows to achieve similar beneficial results.

An Exemplary Semiconductor Device

As discussed above, sub-trenches and fencings are defects caused by varying underlayer resist layer thickness across a semiconductor device. Although the thickness varies within an active area of the semiconductor device, the greatest variation is between the active area and a die seal area (located near an edge of the semiconductor device). Therefore, by eliminating the need to adjust the underlayer etch to account for the die seal area, the process window can be substantially reduced, thereby greatly increasing manufacturing yield and device performance.

Figure 6:
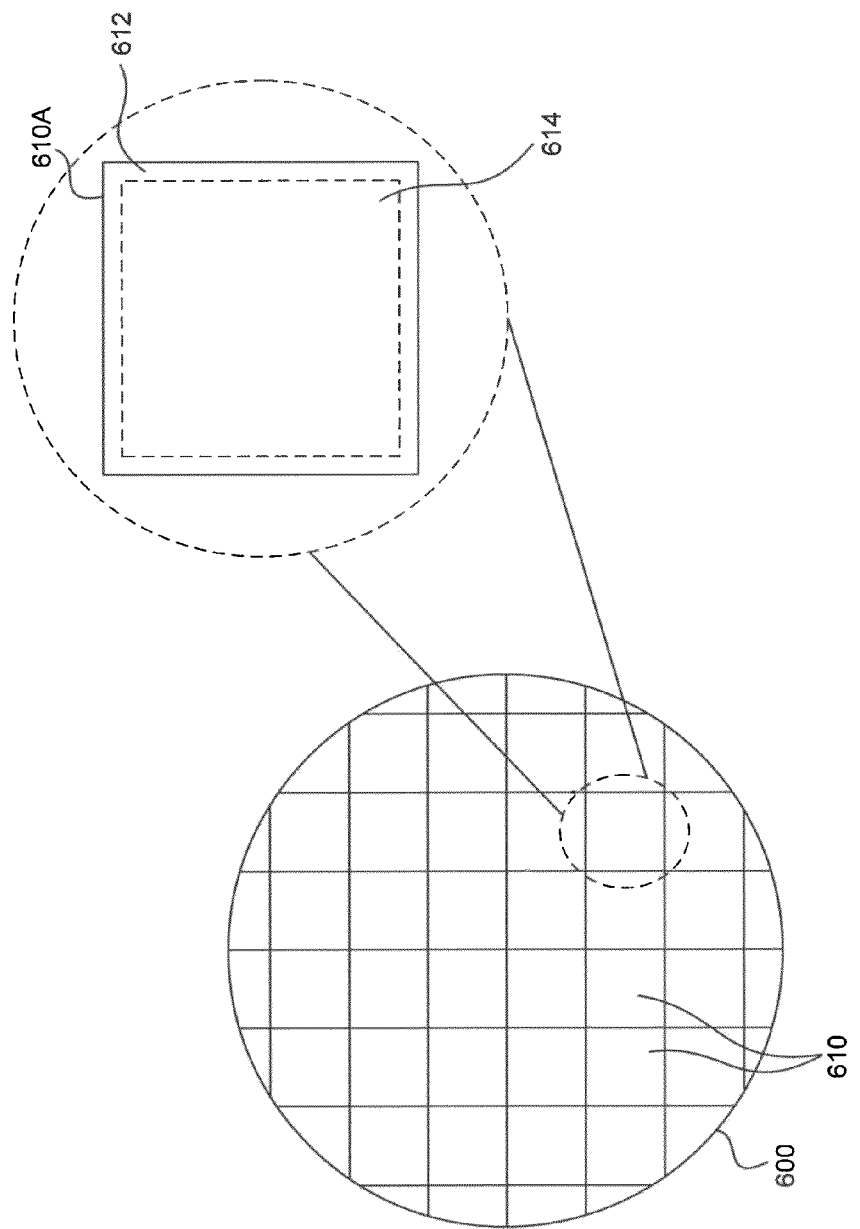
FIG. 6 illustrates a top view of an exemplary semiconductor die, according to an embodiment.

For example, FIG. 6 illustrates a semiconductor die 600 that includes a plurality of semiconductor chips 610 which are to become the semiconductor devices. As shown in the magnified view of FIG. 6, a semiconductor chip 610A includes a die seal area 612 around a perimeter of an active area 614. The die seal area 612 can be used to protect the active area 614 during cutting of the individual semiconductor chip 610A.

Die Seal Area

FIGS. 2A-2H illustrate cross-sectional views of a die seal area 612 of an exemplary semiconductor device 201 according to an embodiment. The semiconductor device 201 includes an etch-stop layer 215 layered over a substrate 210. In embodiments, the substrate 210 can be a bulk silicon substrate or an intermediate metal layer formed over a substrate. A TEOS layer 220, a silicon nitride layer (trench etch stop layer) 225, a trench TEOS layer 230, and a silicon-rich nitride (anti-reflect coating) layer 235 are formed over the etch-stop layer 215, and are separated by trench 250.

In the die seal area 612, an underlayer resist layer 260 is spun on the wafers to fill the trench 250 and to planarize the wafer surface. An underlayer (UL) resist etch back process is used to remove the resist on top of SiRN (silicon-rich nitride) surface 235. As shown in FIG. 2C, the UL resist exists in the die seal area and trench holes only after UL resist etch back, and photoresist patterning process is used to define the trench line. At this time, die seal area is not open during resist patterning process. In particular, as shown in FIG. 2D, a metal resist 265 is deposited over the trench hole.

Figure 2B:
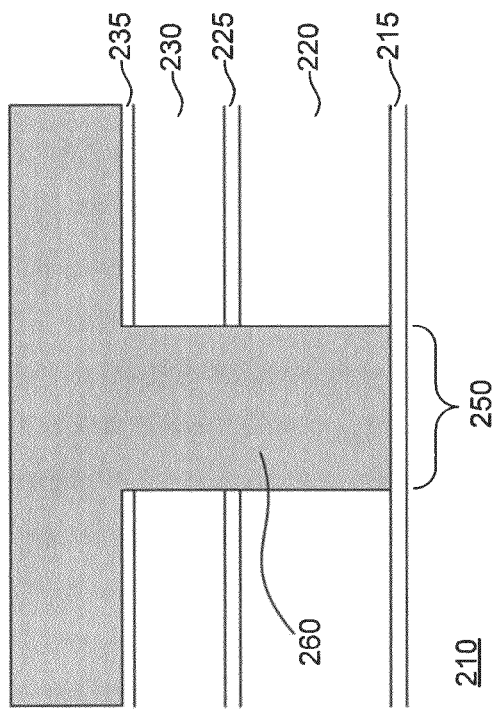
Figure 2A:
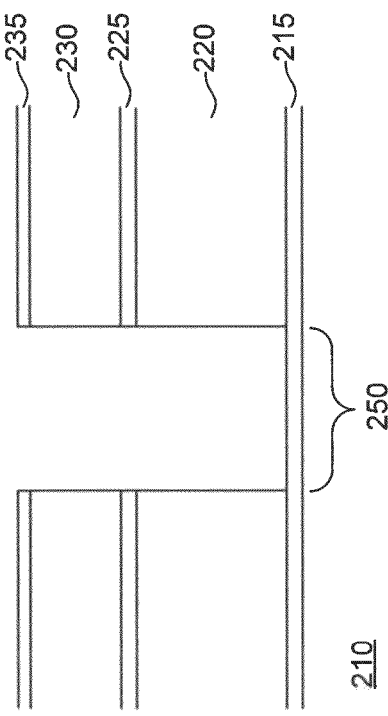
Figure 2F:
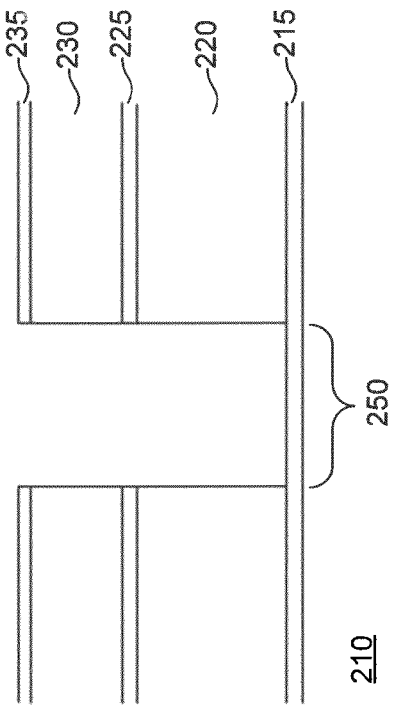
Figure 2E:
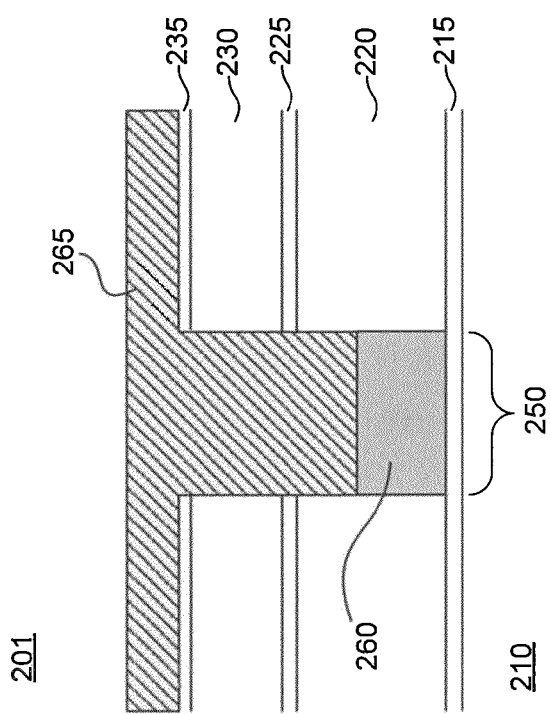
Figure 2H:
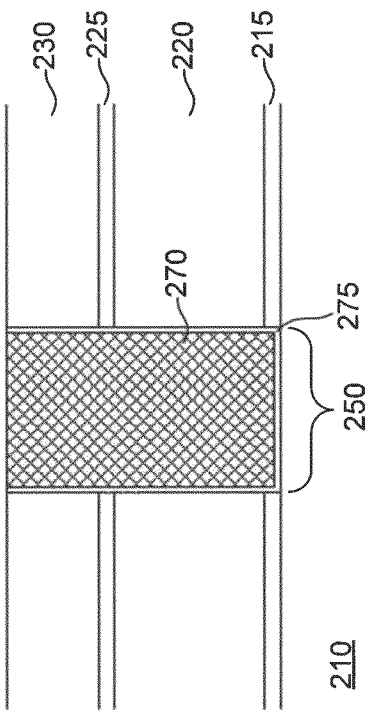

In an embodiment, during the trench oxide etch process, since the die seal is protected by photoresist, as shown in FIG. 2E, the die seal area will not be damaged by trench etch process. Instead, the trench oxide etch process will etch a portion of the metal resist 265. No additional etch particles can be created in the die seal area and cause yield loss.

In a subsequent step of the VFTL process, an ash and SiN etch is performed on the semiconductor device 201. As one skilled in the art will readily recognize, "ashing" is the general process of using a plasma containing oxygen to oxidize ("ash") a photoresist in order to facilitate its removal. The ash+SiN etch removes the remaining underlayer resist layer 260 from the die seal area 612 (as shown in FIG. 2F), as well as the etch-stop layer 215 from the trench 250 (as shown in FIG. 2G).

Figure 2G:
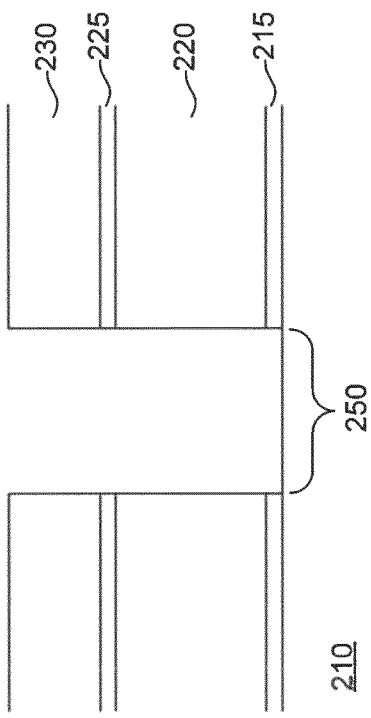

As can be seen in FIG. 2G, this process results in a die seal area 612 without any sub-trenches or fencings. Once the trench has been prepared according to the method described above, the trench can be filled with a barrier layer 275 and a metal conductor material 270 (e.g., metal) to complete the semiconductor device. Further, as will be shown below with respect to FIGS. 3A-3I, by performing the same steps on the active area 614 with a different structural configuration from that of the die seal area 612, sub-trenches and fencing can likewise be avoided in the active area.

Active Area

Figure 3D:
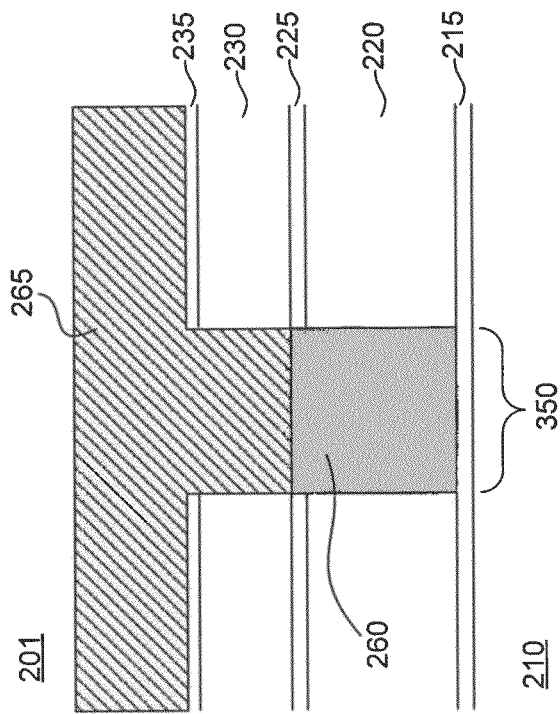
Figure 3C:
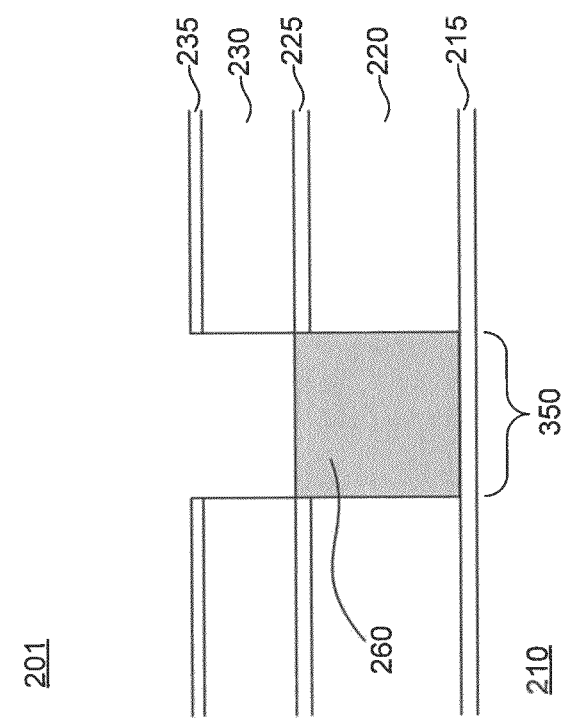
Figure 3F:
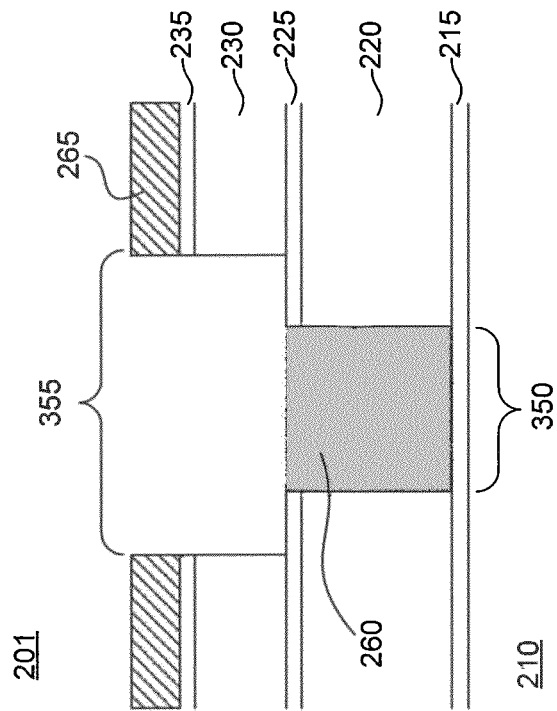
Figure 3E:
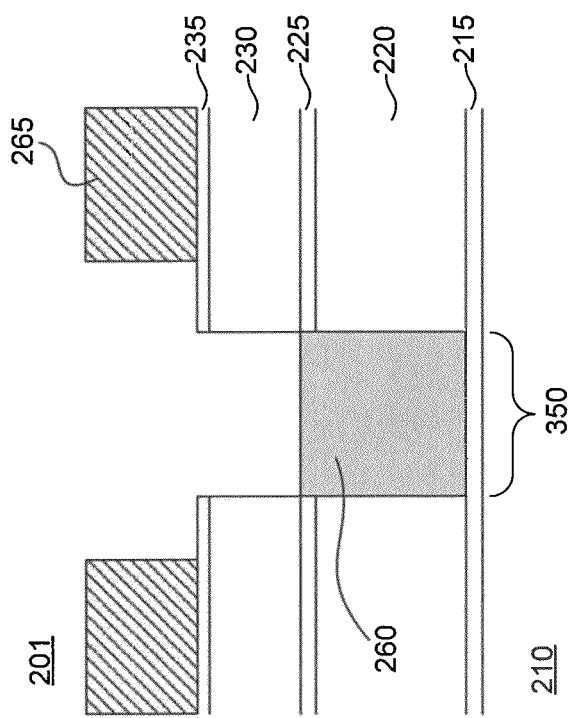

FIGS. 3A-3I are side views of an active area 614 of the exemplary semiconductor device 201 according to an embodiment. Like the die seal area 612, the semiconductor device 201 in the active area 614 also includes an etch-stop layer 215 layered over a substrate 210. A via TEOS layer 220, a silicon nitride (SiN) layer 225, a trench TEOS layer 230, and a silicon-rich nitride (SiRN) layer 235 are formed over the etch-stop layer 215, and are separated by via 350. In addition, an underlayer resist layer 260 is spun on the wafer surface to fill the via 350 and planarize the wafer surface. A UL resist etch back process is used to remove the resist on top of the SiRN layer surface. Additional resist etch will be used to optimize the recess of the resist in the via holes and prevent fencing and sub-trenching that can occur in the active area. Since seal area (thinnest UL resist area) will not be open during trench patterning, the underlayer resist etch back optimization will be easier and the process window will be significantly wider. After etch back, UL resist can only be found in the via holes with proper recesses to provide minimal fencing and sub-trenching at the via corner, as shown for example in FIG. 3C. A second resist (e.g., a metal resist) 265 is then formed over the area (FIG. 3D) and a resist patterning process is used to define trench lines in the active area, as shown in FIG. 3E. Since die seal area is not open during the resist patterning process, the die seal structure is protected by a photoresist during the subsequent trench oxide etch process.

Figure 1C:
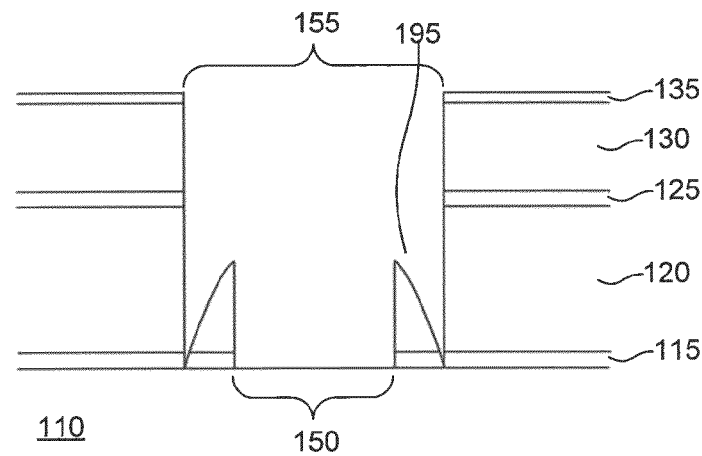

In conventional VFTL processes, the defects are substantially created during this trench oxide etch step. However, the main cause of the defects is due to the inadequate resist recess in the via holes. Specifically, the difference in thickness between the underlayer resist layer 260 in the active area 614 and that of the underlayer resist layer 260 in the die seal area 612 required a choice to be made. By choosing to etch the thicker underlayer resist layer in the active area 614 to a preferred height, the thinner underlayer resist layer in the die seal area 612 became overetched and resulted in sub-trenches, as shown in FIG. 1C. Alternatively, choosing to etch the thinner underlayer resist layer in the die seal area 612 to a preferred height resulted in the thicker underlayer resist layer in the active layer 614 being underetched, which resulted in fencings. Because the trench oxide etch does not affect the die seal area 612 in this embodiment, the underlayer etch can be performed as preferred in the active area 614 without negatively affecting the die seal area 612.

Therefore, as shown in FIG. 3C, the underlayer etch etches the underlayer resist layer 260 to a preferred or predetermined height in the via holes. In an embodiment, the preferred height of the underlayer resist layer 260 after the underlayer etch is approximately even with an upper surface of the silicon nitride layer 225.

As shown in FIG. 3F, the trench oxide etching step etches the silicon-rich nitride layer 235 and the trench TEOS layer 230 at the opening of the second resist 265 to form a trench 355. As shown in FIG. 3F, this TEOS etching step no longer results in the sub-trenches present in the conventionally-processed semiconductor device.

Figure 3H:
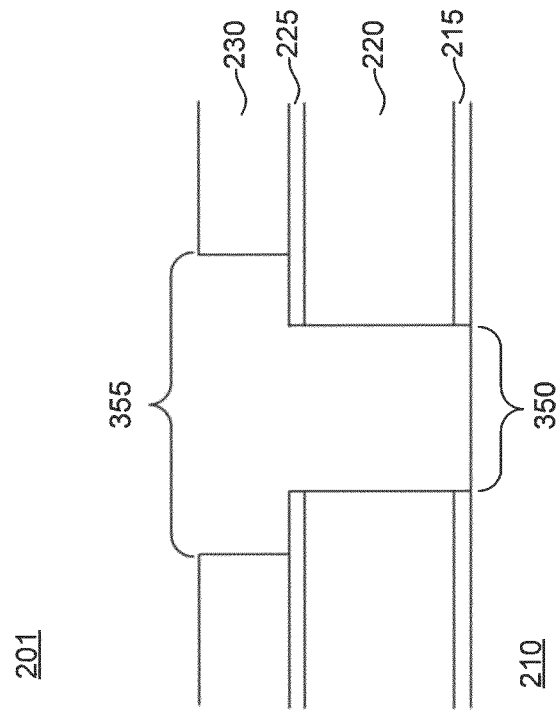
Figure 3G:
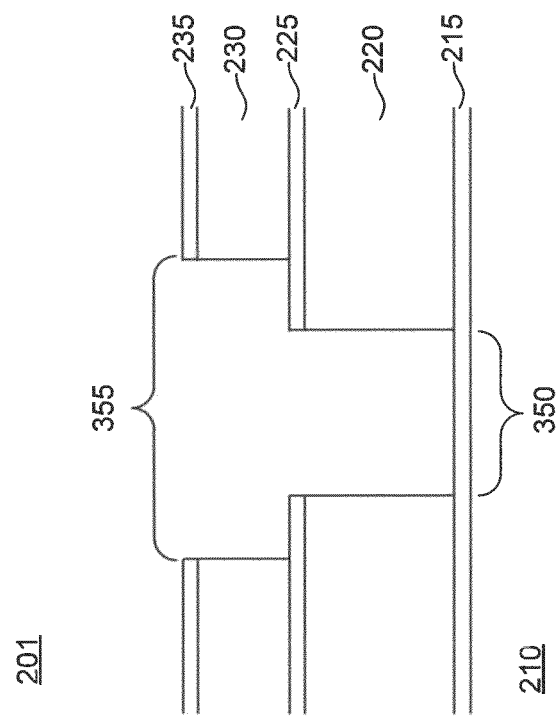
Figure 3I:
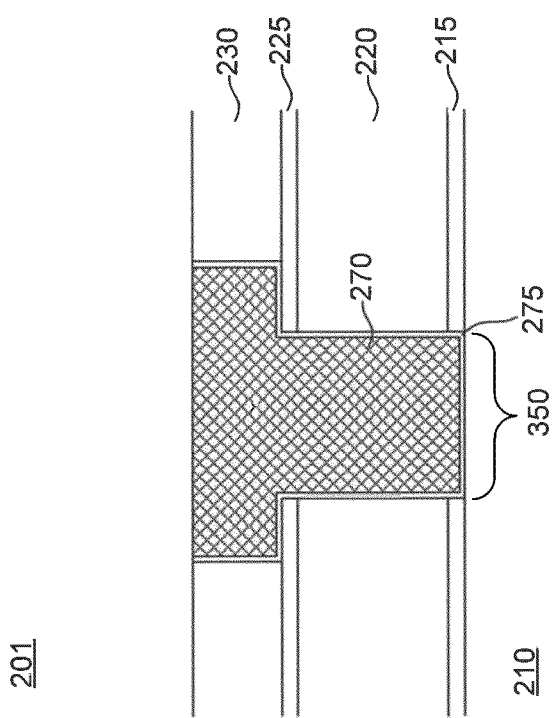

As shown in FIGS. 3G and 3H, the subsequent ash+SiN etching removes the remaining underlayer resist layer 260 from the active area, as well as the portion of the etch-stop layer 215 within the via 350. The result of this process is an active area that lacks both sub-trenches and fencings. Once the trench 355 and via 350 have been prepared, the via 350 and trench 355 can be filled with a barrier layer 275 and a metal conductor material 270, as shown in FIG. 3I. At least the metal conductor material 270 can be deposited in a single deposition so as to be continuous between the via 350 and the trench 355.

In summary, using the above-described method, a semiconductor device can be manufactured with greater ease because the process window has been widen by effectively making the die seal area immaterial during the initial underlayer etching step. As a result, the semiconductor device can be manufactured at lower cost and with greater yield.

FIG. 7 illustrates a cross-sectional view of an exemplary semiconductor device 700 according to an embodiment. The semiconductor device 700 illustrated in FIG. 7 is provided only for the purpose of comparing the resulting structural configuration of the active area versus that of the die seal area, and omits several details not necessary for this purpose.

As shown in FIG. 7, a substrate 750 is provided in both the active area and the die seal area. The active area includes a dual damascene structure formed over the substrate 750 in which a dielectric 740 is etched to have a trench 720 formed over top of a via 710. Both the trench 720 and the via 710 are filled with a continuous metal material 730. The die seal area, does not include the dual damascene structure, but rather includes a single trench 760 that is not coupled with a via formed in the dielectric 740. This trench 760 is filled with a continuous metal material 770. The metal material 770 may be the same or different material as the metal material 730, and may be formed simultaneous with or at a different time from the metal material 730.

Figure 4:
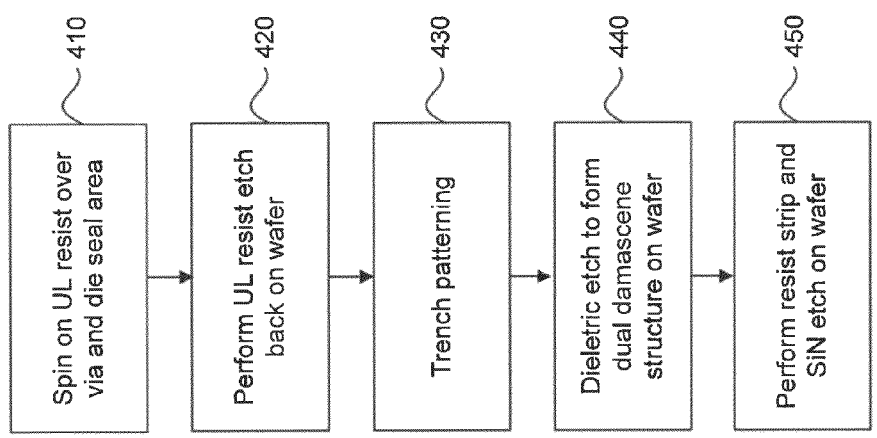
FIG. 4 illustrates a flowchart of an exemplary method of performing VFTL in a semiconductor device, according to an embodiment.

Exemplary Method for Performing VFTL in a Semiconductor Device to Prevent Sub-Trenches or Fencings FIG. 4 illustrates a flowchart 400 of a method for performing VFTL in a semiconductor device, according to an embodiment. For illustration purposes, flowchart 400 is described with continued reference to FIGS. 2A-2G and/or 3A-3I, although method 400 is not limited to these examples.

In step 410, referring to FIG. 2B, an underlayer resist 260 is spun over the via 350 in the active and the trench 250 in the die seal area. As shown in FIGS. 2B and 3B, the underlayer resist 260 is deposited so as to fill the via 350 and the trench 250 and cover an upper surface of the die.

In step 420, a UL resist etch back is performed. Referring to FIGS. 2C and 3C, the UL etch is more recessed in the die seal area as compared to the active area. Meanwhile, referring to FIG. 3C, the UL etch removes a portion of the underlayer resist layer 260 within the via 350 in the active area. The etch is preferably performed to reduce the underlayer resist layer 260 in the active area to a preferred height. In an embodiment, the underlayer resist layer 260 is etched in the active area to be approximately even with an upper surface of silicon layer 225, at least in the active area.

In step 430, a resist patterning process is used to define trench lines (FIG. 3E) in the active area. During the resist patterning process, the die seal area will be covered with resist (FIG. 2D).

In step 440, a dielectric etch is performed to form a dual damascene structure on the active area of the wafer. Referring to FIG. 2E, the trench 250 in the die seal area is protected by the resist it will not be etched away during this process step. Referring to FIG. 3F, the trench etch removes both silicon-rich nitride layer 235 and trench TEOS layer 230 from within the opening of the photoresist 380 to form the trench 355.

In step 450, an ash+SiN etch is performed. Referring to FIGS. 2F/2G and 3G/3H, this process removes any remaining underlayer resist layer 260 and exposes SiRN and SiN layers (235, 225, and 215). The result of this method is a die seal area (e.g., FIG. 2D) that lacks sub-trenches or fencings within its trench 250, and an active area (e.g., FIG. 3G) that lacks sub-trenches or fencings within its via 350 and/or trench 355.

Those skilled in the relevant art(s) will recognize that the above method can additionally or alternatively include any of the steps or substeps described above with respect to FIGS. 2A-2H and/or 3A-3I, as well as any of their modifications. Further, the above description of the exemplary method should not be construed to limit the description of the method depicted in FIGS. 2A-H2G and/or 3A-3I described above.

Figure 5:
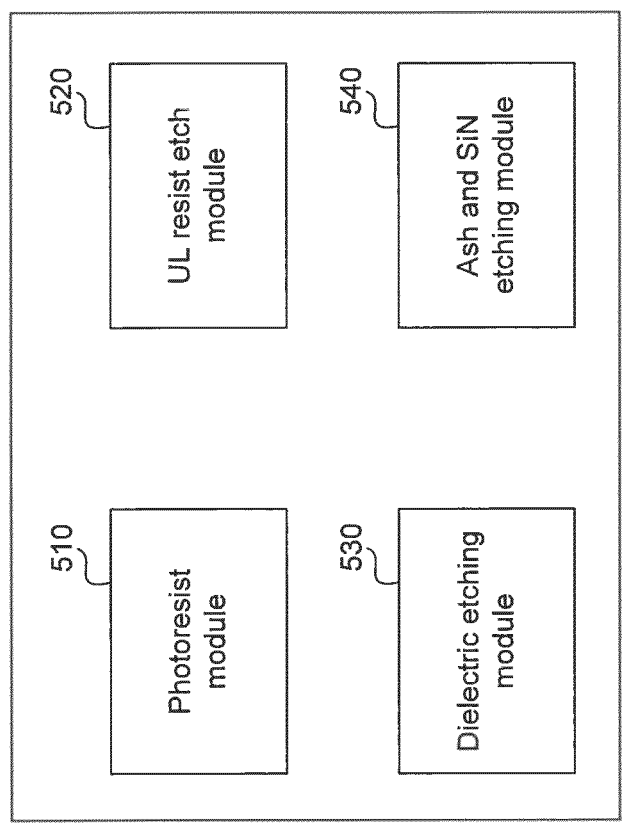
FIG. 5 illustrates a block diagram of an exemplary apparatus for performing VFTL in a semiconductor device, according to an embodiment.

Exemplary Apparatus for Performing VFTL in a Semiconductor Device to Prevent Sub-Trenches or Fencings FIG. 5 illustrates a block diagram of an exemplary apparatus for performing VFTL in a semiconductor device, according to an embodiment. The apparatus 500 includes a photoresist module 510, a UL resist etching module 520, a dielectric etching module 530, and an ash+SiN etching module 540. For illustration purposes, apparatus 500 is described with continued reference to FIGS. 2A-2H and/or 3A-3I, although apparatus 500 is not limited to these examples.

The photoresist module 510 is configured to spin on a continuous photoresist layer 260 over a die seal area of a semiconductor device that covers the trenches 250 of the die seal area, and is also configured to deposit a photoresist layer 380 over an active area of the semiconductor device that has openings over the vias 350 of the active area. The widths of the openings of the photoresist 380 in the active area should be a preferred width of a trench 355 to be formed later.

The UL resist etching module 520 performs a UL etch of the semiconductor device. Referring to FIG. 2C, the resulting resist height in the die seal area trench 250 will be lower that the resist height in the active area vias 250, but since the die seal area will be covered with resist during the trench etch process, the lower UL resist in the die seal area will not have any etch damage. Referring to FIG. 3C, the UL etch removes a portion of the underlayer resist layer 260 within the via 350 in the active area. The etch is preferably performed to reduce the underlayer resist layer 260 in the active area to a preferred height. In an embodiment, the underlayer resist layer 260 is etched in the active area to be approximately even with an upper surface of silicon layer 225.

After UL etch, the wafer will go back to photoresist module 510 for trench patterning. At this time, the trench lines will be defined in the active area. As mentioned before, the die seal area will be covered with resist during this resist patterning process.

The dielectric etching module 530 is configured to perform a TEOS etch of the semiconductor device. Referring to FIG. 2E, the TEOS etch will not remove oxide in the die seal area since the resist exists in this area. Referring to FIG. 3F, the TEOS etch removes silicon-rich nitride layer 235 and trench TEOS layer 230 from within the opening of the photoresist 380 to form the trench 355.

The ash+SiN etching module 540 is configured to perform an ash+SiN etch of the semiconductor device. Referring to FIGS. 2F and 3G, this resist ash process removes any remaining resist layer 380 and 260 from the wafer surface. Following the resist ash process, an SiN etch process will remove a top SiRN, trench and bottom SiN layers from the trench/via openings. The result of this method is a die seal area (e.g., FIG. 2G) that lacks sub-trenches or fencings in its trenches 250, and an active area (e.g., FIG. 3H) that lacks sub-trenches or fencings within its vias 350 and/or trenches 355. After Cu fill and CMP process, metal can be filled in the via and/or trench, as shown for example in FIG. 2H for the die seal area and in FIG. 3I for the active area of the semiconductor device.

Those skilled in the relevant art(s) will recognize that the above apparatus 500 can additionally or alternatively be configured to perform any of the steps or substeps described above with respect to FIGS. 2A-2H and/or 3A-3I, as well as any of their modifications. Further, the above description of the exemplary apparatus 500 should not be construed to limit the description of the method depicted in FIGS. 2A-2H and/or 3A-3I.

CONCLUSION

It is to be appreciated that the Detailed Description section, and not the Abstract section, is intended to be used to interpret the claims. The Abstract section may set forth one or more, but not all exemplary embodiments, and thus, is not intended to limit the disclosure and the appended claims in any way.

Embodiments of the invention have been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the disclosure. Thus, the invention should not be limited by any of the above-described exemplary embodiments, but should be defined only in accordance with the following claims and their equivalents.

What is claimed is:

1. A method of forming a semiconductor device having a via disposed in an active area and a first trench disposed in a die seal area, the method comprising:
   filling the via and the first trench with an underlayer resist;
   performing an underlayer etch of the underlayer resist in the via and the first trench to remove a portion of the underlayer resist from the via and the first trench;
   resist patterning a metal material in the active area to define a second trench overlapping with the via, and in the die seal area to cover the first trench;
   performing a tetraethylorthosilicate (TEOS) etch of the active area and the die seal area; and
   performing an ash and SiN etch of the active area and the die seal area,
   wherein the metal material in the first trench protects the first trench during the TEOS etch.

2. The method of claim 1, wherein the via and the first trench are defined by a silicon nitride etch-stop layer, a first TEOS layer, a trench silicon nitride etch stop layer, a second TEOS layer, and a silicon-rich nitride layer, and
   wherein both the via and the first trench are filled with an underlayer resist.

3. The method of claim 2, wherein the underlayer etch etches a portion of the underlayer resist in the active area.

4. The method of claim 2, wherein the TEOS etch etches the second TEOS layer and the silicon-rich nitride within the opening of the via in the active area.

5. The method of claim 2, wherein the ash and SiN etch removes remaining underlayer resist in the via of the active area and in the first trench of the die seal area.

6. The method of claim 2, wherein the ash and SiN etch removes a portion of the silicon nitride etch-stop layer overlapping with the via and the first trench.

7. A method of forming a semiconductor device having a via disposed in an active area and a first trench disposed in a die seal area, the method comprising:
- depositing an underlayer resist on the semiconductor device so as to fill the via and the first trench;
- etching a portion of the underlayer resist from the via and the first trench;
- patterning a second resist in the via and the first trench;
- removing a portion of the second resist from the via so as to define trench lines of the first via; and
- etching the active area and the die seal area to form a second trench in the active area,
- wherein the second resist protects the first trench in the die seal area from being etched during the etching.

8. The method of claim 7, wherein the via and the first trench are defined by an etch-stop layer, a via layer, and a trench layer.

9. The method of claim 8, wherein the depositing comprises depositing the underlayer resist on the trench layer in the active area and the die seal area.

10. The method of claim 8, wherein the removing of the second resist comprises removing only so much of the second resist from the die seal area so as to maintain second resist material in the first trench, and over a top surface of the die seal area.

11. The method of claim 8, wherein the etching of the active area and the die seal area comprises removing the underlayer resist and the second resist from the first via in the active area and the second via in the die seal area.

12. The method of claim 8, wherein the second trench is formed so as to be wider than the via.

13. The method of claim 8, wherein the second trench is formed so as to be narrower than the via.

* * * * *

UNITED STATES PATENT AND TRADEMARK OFFICE
CERTIFICATE OF CORRECTION

PATENT NO. : 8,912,093 B2  Page 1 of 1
APPLICATION NO. : 13/865714
DATED : December 16, 2014
INVENTOR(S) : Fei Wang It is certified that error appears in the above-identified patent and that said Letters Patent is hereby corrected as shown below:

On the title page, item (56), References Cited, Foreign Patent Documents, line 2:

"KR 10-2003-0095445 A" should read --KR 10-2003-0095446 A--.

Signed and Sealed this
Second Day of June, 2015

Michelle K. Lee
*Director of the United States Patent and Trademark Office*